United States Patent
Kobayashi

(10) Patent No.: US 7,850,864 B2
(45) Date of Patent: Dec. 14, 2010

(54) PLASMA TREATING APPARATUS AND PLASMA TREATING METHOD

(75) Inventor: Yoshiyuki Kobayashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 752 days.

(21) Appl. No.: 11/688,501

(22) Filed: Mar. 20, 2007

(65) Prior Publication Data
US 2007/0215283 A1    Sep. 20, 2007

Related U.S. Application Data

(60) Provisional application No. 60/809,406, filed on May 31, 2006.

(30) Foreign Application Priority Data

Mar. 20, 2006    (JP)    .............................. 2006-076195

(51) Int. Cl.
*B44C 1/22*    (2006.01)
(52) U.S. Cl. .............................. 216/58; 216/63; 216/67; 156/345.29; 156/345.35; 156/345.39
(58) Field of Classification Search ................... 216/58, 216/63, 67; 156/345.29, 345.35, 345.39
See application file for complete search history.

(56) References Cited

U.S. PATENT DOCUMENTS

| | | | |
|---|---|---|---|
| 3,663,793 A | 5/1972 | Petro et al. | |
| 3,990,860 A | 11/1976 | Fletcher et al. | |
| 4,205,051 A | 5/1980 | Takahashi et al. | ........... 423/266 |
| 4,219,359 A | 8/1980 | Miwa et al. | ................. 501/135 |

(Continued)

FOREIGN PATENT DOCUMENTS

EP    0 822 584 A2    2/1998

(Continued)

OTHER PUBLICATIONS

U.S. Appl. No. 11/688,565, filed Mar. 20, 2007, Kobayashi, et al.

(Continued)

*Primary Examiner*—Lan Vinh
*Assistant Examiner*—Maki A Angadi
(74) *Attorney, Agent, or Firm*—Oblon, Spivak, McClelland, Maier & Neustadt, L.L.P.

(57) ABSTRACT

There are proposed a plasma treating apparatus and a plasma treating method using the same capable of improving the durability of site, member and parts in a chamber used for plasma etching in a corrosive gas atmosphere, which are exposed to the plasma atmosphere, and improving the resistance to plasma erosion of a coating formed on the surface of the member or the like in the corrosive gas atmosphere and preventing the occurrence of particles of a corrosion product even under a high plasma power. As a means therefore, in a plasma treating apparatus wherein a surface of a body to be treated in a chamber is subjected to a plasma treatment with an etching gas, at least surfaces of sites of the chamber itself exposing to the plasma atmosphere, or surfaces of a member or parts accommodated in the chamber are covered with a composite layer including a porous layer made from a metal oxide and a secondary recrystallized layer of the metal oxide formed on the porous layer.

11 Claims, 7 Drawing Sheets

U.S. PATENT DOCUMENTS

| | | | |
|---|---|---|---|
| 4,536,228 A | 8/1985 | Treharne | |
| 4,997,809 A | 3/1991 | Gupta | |
| 5,004,712 A | 4/1991 | Borglum | |
| 5,024,992 A | 6/1991 | Morris | 505/482 |
| 5,032,248 A | 7/1991 | Kanamaru et al. | |
| 5,057,335 A | 10/1991 | Hanagata et al. | 427/512 |
| 5,093,148 A | 3/1992 | Christodoulou et al. | |
| 5,128,316 A | 7/1992 | Agostinelli et al. | 505/237 |
| 5,206,059 A | 4/1993 | Marantz | |
| 5,316,859 A | 5/1994 | Marada et al. | |
| 5,366,585 A * | 11/1994 | Robertson et al. | 216/67 |
| 5,397,650 A | 3/1995 | Harada et al. | |
| 5,427,823 A | 6/1995 | Varshney et al. | |
| 5,432,151 A | 7/1995 | Russo et al. | 505/474 |
| 5,472,793 A | 12/1995 | Harada et al. | |
| 5,562,840 A | 10/1996 | Swain et al. | 216/65 |
| 5,909,354 A | 6/1999 | Harada et al. | |
| 5,922,275 A | 7/1999 | Kageyama et al. | |
| 6,010,966 A * | 1/2000 | Ionov | 438/706 |
| 6,045,665 A | 4/2000 | Ohhashi et al. | |
| 6,120,640 A | 9/2000 | Shih et al. | |
| 6,132,890 A | 10/2000 | Harada et al. | |
| 6,180,259 B1 | 1/2001 | Harada et al. | |
| 6,250,251 B1 | 6/2001 | Akiyama et al. | |
| 6,261,962 B1 | 7/2001 | Bhardwaj et al. | |
| 6,265,250 B1 * | 7/2001 | Yu | 438/162 |
| 6,306,489 B1 | 10/2001 | Hellmann et al. | |
| 6,319,419 B1 | 11/2001 | Ohhashi et al. | |
| 6,326,063 B1 | 12/2001 | Harada et al. | |
| 6,383,964 B1 | 5/2002 | Nakahara et al. | |
| 6,447,853 B1 | 9/2002 | Suzuki et al. | |
| 6,451,647 B1 * | 9/2002 | Yang et al. | 438/240 |
| 6,509,070 B1 | 1/2003 | Voevodin et al. | 427/572 |
| 6,547,921 B2 | 4/2003 | Suzuki et al. | |
| 6,558,505 B2 | 5/2003 | Suzuki et al. | |
| 6,586,348 B2 * | 7/2003 | Hartner et al. | 438/785 |
| 6,738,863 B2 | 5/2004 | Butterworth et al. | |
| 6,771,483 B2 | 8/2004 | Harada et al. | |
| 6,777,045 B2 | 8/2004 | Lin et al. | |
| 6,783,863 B2 | 8/2004 | Harada et al. | |
| 6,797,957 B2 | 9/2004 | Kawakubo et al. | 250/338.2 |
| 6,805,968 B2 | 10/2004 | Saito et al. | |
| 6,834,613 B1 | 12/2004 | Miyazaki et al. | |
| 6,852,433 B2 | 2/2005 | Maeda | |
| 6,884,516 B2 | 4/2005 | Harada et al. | |
| 6,916,534 B2 | 7/2005 | Wataya et al. | 428/402 |
| 7,494,723 B2 | 2/2009 | Harada et al. | |
| 7,497,598 B2 | 3/2009 | Masaki et al. | |
| 7,535,868 B2 | 5/2009 | Black et al. | |
| 2004/0061431 A1 | 4/2004 | Takeuchi et al. | 313/495 |
| 2004/0214026 A1 | 10/2004 | Harada et al. | |
| 2005/0103275 A1 | 5/2005 | Sasaki et al. | |
| 2005/0147852 A1 | 7/2005 | Harada et al. | |
| 2006/0099444 A1 | 5/2006 | Moriya et al. | |
| 2006/0099457 A1 | 5/2006 | Moriya et al. | |
| 2007/0026246 A1 | 2/2007 | Harada et al. | |
| 2007/0054092 A1 | 3/2007 | Harada et al. | |
| 2009/0120358 A1 | 5/2009 | Harada et al. | |
| 2009/0130436 A1 | 5/2009 | Harada et al. | |
| 2009/0208667 A1 | 8/2009 | Harada et al. | |

FOREIGN PATENT DOCUMENTS

| | | |
|---|---|---|
| EP | 1 156 130 A1 | 11/2001 |
| JP | 50-075370 | 6/1975 |
| JP | 58-192661 | 11/1983 |
| JP | 58-202535 | 11/1983 |
| JP | 59-96273 | 6/1984 |
| JP | 61-30658 | 2/1986 |
| JP | 61-104062 | 5/1986 |
| JP | 61-113755 | 5/1986 |
| JP | 62-253758 | 11/1987 |
| JP | 64-039728 | 2/1989 |
| JP | 01-139749 | 6/1989 |
| JP | 03-115535 | 5/1991 |
| JP | 03-247769 | 11/1991 |
| JP | 04-202660 | 7/1992 |
| JP | 4-276059 | 10/1992 |
| JP | 05-117064 | 5/1993 |
| JP | 05-238859 | 9/1993 |
| JP | 06-057396 | 3/1994 |
| JP | 06-136505 | 5/1994 |
| JP | 06-142822 | 5/1994 |
| JP | 06-196421 | 7/1994 |
| JP | 06-220618 | 8/1994 |
| JP | 07-035568 | 4/1995 |
| JP | 07-102366 | 4/1995 |
| JP | 07-126827 | 5/1995 |
| JP | 07-176524 | 7/1995 |
| JP | 08-037180 | 2/1996 |
| JP | 08-339895 | 12/1996 |
| JP | 09-048684 | 2/1997 |
| JP | 09-069554 | 3/1997 |
| JP | 09-216075 | 8/1997 |
| JP | 09-272987 | 10/1997 |
| JP | 09-316624 | 12/1997 |
| JP | 10-4083 | 1/1998 |
| JP | 10-045461 | 2/1998 |
| JP | 10-045467 | 2/1998 |
| JP | 10-144654 | 5/1998 |
| JP | 10-163180 | 6/1998 |
| JP | 10-202782 | 8/1998 |
| JP | 10-226869 | 8/1998 |
| JP | 10-330971 | 12/1998 |
| JP | 11-080925 | 3/1999 |
| JP | 11-207161 | 8/1999 |
| JP | 11-345780 | 12/1999 |
| JP | 2000-54802 | 2/2000 |
| JP | 2000-072529 | 3/2000 |
| JP | 3076768 | 6/2000 |
| JP | 2000-191370 | 7/2000 |
| JP | 2000-228398 | 8/2000 |
| JP | 2001-031484 | 2/2001 |
| JP | 2001-164354 | 6/2001 |
| JP | 2001-164354 A | 6/2001 |
| JP | 2001-335915 | 12/2001 |
| JP | 2001-342553 | 12/2001 |
| JP | 2002-80954 | 3/2002 |
| JP | 2002-89607 | 3/2002 |
| JP | 2003-95649 | 4/2003 |
| JP | 2003-264169 | 9/2003 |
| JP | 2003-321760 | 11/2003 |
| JP | 2004-003022 | 1/2004 |
| JP | 2004-10981 | 1/2004 |
| JP | 2004-149915 | 5/2004 |
| JP | 2004-190136 | 7/2004 |
| JP | 2004-522281 | 7/2004 |
| JP | 2004-269951 | 9/2004 |
| JP | 2005-256098 | 9/2005 |
| JP | 2006-118053 A | 5/2006 |
| JP | 2007-070175 A | 3/2007 |
| JP | 2007-138302 A | 6/2007 |
| JP | 2007-516921 | 6/2007 |
| JP | 2007-314886 A | 12/2007 |
| KR | 10-248081 | 12/1999 |
| KR | 10-0268052 | 10/2000 |
| KR | 2002-0003367 | 1/2002 |
| KR | 10-2007-030718 | 3/2007 |
| WO | WO 01/42526 A1 | 6/2001 |
| WO | WO 2004/095532 A2 | 11/2004 |
| WO | WO 2005/062758 | 7/2005 |
| WO | WO 2007-013184 | 2/2007 |
| WO | WO 2007/013184 A1 | 2/2007 |
| WO | WO 2007-023971 | 3/2007 |

| | | |
|---|---|---|
| WO | WO 2007-023976 | 3/2007 |

OTHER PUBLICATIONS

Magome, Masakatsu, JIS Using Series: Spraying Technique Manual, p. 95, Oct. 30, 1998. (with English translation).

Masakatsu Magome, "The page 33 of Spray Coating Technical Manual", Series of JIS Manual, issued by Japanese Standards Association on Oct. 30, 1998, 6 pages (with English translation).

U.S. Appl. No. 12/293,974, filed Sep. 22, 2008, Harada et al.

* cited by examiner

PLASMA TREATING APPARATUS AND PLASMA TREATING METHOD

FIELD OF THE INVENTION

This invention relates to a plasma treating apparatus and a plasma treating method used in the field of the semiconductor processing technique. Particularly, the invention relates to a plasma treating apparatus and a plasma treating method for subjecting a semiconductor element or the like to a plasma etching under an environment constituted with an atmosphere of a halogen gas, an inert gas, oxygen, hydrogen or the like, or an atmosphere of a gas containing fluorine and a fluorine compound (hereinafter referred to as "F-containing gas") and a hydrocarbon gas (hereinafter referred to as "CH-containing gas"), or an environment of alternately and repeatedly forming these atmospheres.

BACKGROUND OF THE INVENTION

In case of treating the device used in the field of semiconductor and liquid crystal, there is frequently utilized plasma energy of a halogen based corrosive gas having a high corrosiveness. For example, in a plasma etching treatment (processing) device as one of the semiconductor processing devices, plasma is generated in a chlorine-based or fluorine-based gas atmosphere having a strong corrosiveness or in a mixed gas atmosphere of these gas and an inert gas, and the semiconductor element is subjected to an etching by utilizing a strong reactivity of ions or electrons excited.

In this processing technique, at least a part of the wall of the reactor or the member or members disposed in the interior thereof (susceptor, antistatic chuck, electrode and the like) are easily subjected to an erosion action by the plasma energy, and hence it is important to use materials having an excellent resistance to plasma erosion. As to such a requirement, there have hitherto been used a metal (inclusive of alloys) having a good resistance to corrosion, and inorganic materials such as quartz, alumina and the like. For example, JP-A-H10-4083 discloses a technique wherein the above material is applied onto the surface of the above member inside the reactor by PVD process or CVD process, or a dense film made from an oxide of a Group IIIa element in the Periodic Table is formed thereon, or $Y_2O_3$ single crystal is applied thereon. Also, JP-A-2001-164354 or JP-A-2003-264169 discloses a technique wherein $Y_2O_3$ as an oxide of an element belonging to Group IIIa in the Periodic Table is applied on the surface of the member through a spraying process to improve the resistance to plasma erosion.

However, the technique disclosed in JP-A-H10-4083 of applying the metallic oxide of the Group IIIa element in the Periodic Table or the like indicates a relatively good resistance to plasma erosion, but it is a situation in which this technique is not a sufficient countermeasure in the field of recent semiconductor processing technique requiring a higher precision and an environmental cleanness in a severer atmosphere of the corrosive gas.

Also, the member covered with the $Y_2O_3$ spray coating as disclosed in JP-A-2001-164354 and JP-A-2003-264169 serves to improve the resistance to plasma erosion, but is required to be further improved because the processing of the recent semiconductor members is under severer conditions that fluorine based gas having a strong corrosiveness and hydrocarbon based gas are alternately and repeatedly used as a processing atmosphere in addition to the plasma etching action of a further higher output.

Particularly, when the F-containing gas and the CH-containing gas are alternately and repeated used, the formation of a fluoride having a high steam pressure is caused by a strong corrosion reaction inherent to the halogen gas in the F-containing gas atmosphere, while in the CH-containing gas atmosphere, the decomposition of the fluorine compound produced in the F-containing gas is promoted or a part of the film component is changed into a carbide to enhance more reaction into a fluoride. Under the plasma environment these reactions are promoted to generate a very severe corrosion environment. Particularly, when the etching is carried out at a high plasma output, the potential difference between the plasma and the inner wall of the plasma treating vessel (chamber) becomes large, and hence the $Y_2O_3$ spray coating adhered to the inner wall face is corroded. As a result, the particles of the corrosion product produced under such an environment are fallen off and adhered onto the surface of the integrated circuit of the semiconductor product, which causes the damage of the device.

DISCLOSURE OF THE INVENTION

It is an object of the invention to improve the durability of a site of a chamber itself, member and parts disposed therein used for conducting the plasma etching in the corrosive gas atmosphere, which are exposed to the plasma atmosphere (hereinafter abbreviated as "member and the like" simply).

It is another object of the invention to improve the resistance to plasma erosion of a coating formed on the surface of the member and the like in the corrosive gas atmosphere.

It is the other object of the invention to propose a plasma treating method capable of preventing the generation of particles of a corrosion product even at a high plasma output.

As a means for achieving the above objects, the invention proposes a plasma treating apparatus comprising a chamber for accommodating a body to be treated with a plasma of an etching gas, a site of the chamber itself exposed to a plasma forming atmosphere, and a member or parts disposed in the chamber, in which one or more surfaces of the site, member and parts are provided with a composite layer consisting of a porous layer made of a metal oxide and a secondary recrystallized layer of the metal oxide formed on the porous layer.

The plasma treating apparatus according to the invention may adopt the following constructions.

1. An undercoat layer made from a metal-alloy, ceramic or cermet is disposed beneath the porous layer.
2. The etching treatment is carried out by any one system of a treatment with a fluorine-containing gas plasma, a treatment with a mixed gas plasma of a fluorine-containing gas and a hydrocarbon-containing gas, a treatment alternately and repeatedly introducing a fluorine-containing gas and a hydrocarbon-containing gas.
3. As the fluorine-containing gas are used one or more gases selected from a $C_xF_y$ gas such as $CF_4$, $C_4F_8$ or the like, a CHF based gas, a HF based gas, a SF based gas and a mixed gas of such a gas and $O_2$.
4. As the hydrocarbon-containing gas are used one or more gases selected from a $C_xH_y$ gas such as $CH_4$, $C_2H_2$ or the like, a H-containing gas such as $NH_3$ or the like, and a mixed gas of $C_xH_y$ gas and $O_2$ such as $CH_4$ and $O_2$, $CH_3F$ and $O_2$, $CH_2F_2$ and $O_2$ or the like.
5. The metal oxide is a metal oxide including an element of Group IIIa such as Sc, Y, lanthanide or the like.
6. The secondary recrystallized layer is formed by subjecting the primary transformed metal oxide included in the porous layer to a high energy irradiation treatment to conduct secondary transformation.

7. The secondary recrystallized layer is a layer of a tetragonal system structure formed by subjecting the porous layer including a rhombic system crystal to a high energy irradiation treatment to conduct secondary transformation.
8. The high energy irradiation treatment is an electron beam irradiation treatment or a laser beam irradiation treatment.
9. A difference of potential between the site, member or parts exposed to the plasma atmosphere in the chamber and the plasma is not less than 120 V but not more than 550 V.
10. The difference of potential is controlled by a high frequency power applied to a mount base for the body to be treated in the chamber.

Also, the invention proposes a method for treating with plasma by subjecting a surface of a body to be treated in a chamber to a plasma treatment with an etching gas, which comprises a step of forming and covering a composite layer including a porous layer made from a metal oxide and a secondary recrystallized layer of the metal oxide formed on the porous layer onto surfaces of sites of the chamber itself exposing to the plasma atmosphere, or surfaces of a member or parts accommodated in the chamber, and a step of introducing a first gas including a fluorine-containing gas into the chamber and exciting the gas to generate a first plasma.

Furthermore, the invention proposes a method for treating with plasma by subjecting a surface of a body to be treated in a chamber to a plasma treatment with an etching gas, which comprises a step of forming and covering a composite layer including a porous layer made from a metal oxide and a secondary recrystallized layer of the metal oxide formed on the porous layer onto surfaces of sites of the chamber itself exposing to the plasma atmosphere, or surfaces of a member or parts accommodated in the chamber, a step of introducing a first gas including a fluorine-containing gas into the chamber and exciting the gas to generate a first plasma and a step of introducing a second gas including a hydrocarbon gas into the chamber and exciting the gas to generate a second plasma.

Moreover, the above plasma treating methods according to the invention may adopt the following constructions.
1. As the fluorine-containing gas is used at least one selected from a $C_xF_y$ gas such as $CF_4$, $C_4F_8$ or the like, a CHF based gas, a HF based gas, a SF based gas and a mixed gas with $O_2$ thereof.
2. As the hydrocarbon containing gas is used at least one selected from a $C_xH_y$ gas such as $CH_4$, $C_2H_2$ or the like, a H-containing gas such as $NH_3$ or the like, and a mixed gas of $C_xH_y$ gas and $O_2$ such as $CH_4$ and $O_2$, $CH_3F$ and $O_2$, $CH_2F_2$ and $O_2$ or the like.
3. The metal oxide is a metal oxide including a Group IIIA element such as Sc, Y and lanthanoide.
4. The secondary recrystallized layer is formed by subjecting the primary transformed metal oxide included in the porous layer to a high energy irradiation treatment to conduct secondary transformation.
5. The secondary recrystallized layer is a layer of a tetragonal system structure formed by subjecting the porous layer including a rhombic system crystal to a high energy irradiation treatment to conduct secondary transformation.
6. The high energy irradiation treatment is an electron beam irradiation treatment or a laser beam irradiation treatment.
7. A difference of potential between the site, member or parts exposed to the plasma atmosphere in the chamber and the plasma is not less than 120 V but not more than 550 V.
8. The difference of potential is controlled by a high frequency power applied to a mount base for the body to be treated in the chamber.

According to the invention having the above-mentioned construction, when semiconductor parts or liquid crystal parts are subjected to a plasma etching, the durability to plasma erosion can be provided to the parts and the like inside the chamber in the plasma atmosphere, particularly the F-containing gas atmosphere or the corrosive gas atmosphere such as halogen and the like alternately and repeatedly forming the F-containing gas atmosphere and the CH-containing gas atmosphere over a long period of time.

Furthermore, according to the invention, the particles of the corrosion product resulted from the plasma etching treatment or the difference of potential between the member or the like in the chamber and the plasma become less and it is possible to efficiently produce semiconductor parts and the like having a high quality.

Moreover, according to the invention, a peculiar coating is formed on the surfaces of the member and the like, so that the plasma output can be raised up to about 550 V, whereby the etching rate or the etching effect is increased and hence there is obtained an effect of attaining the miniaturization and weight reduction of the plasma treating apparatus.

DESCRIPTION OF THE PREFERRED EMBODIMENTS

Figure 1:
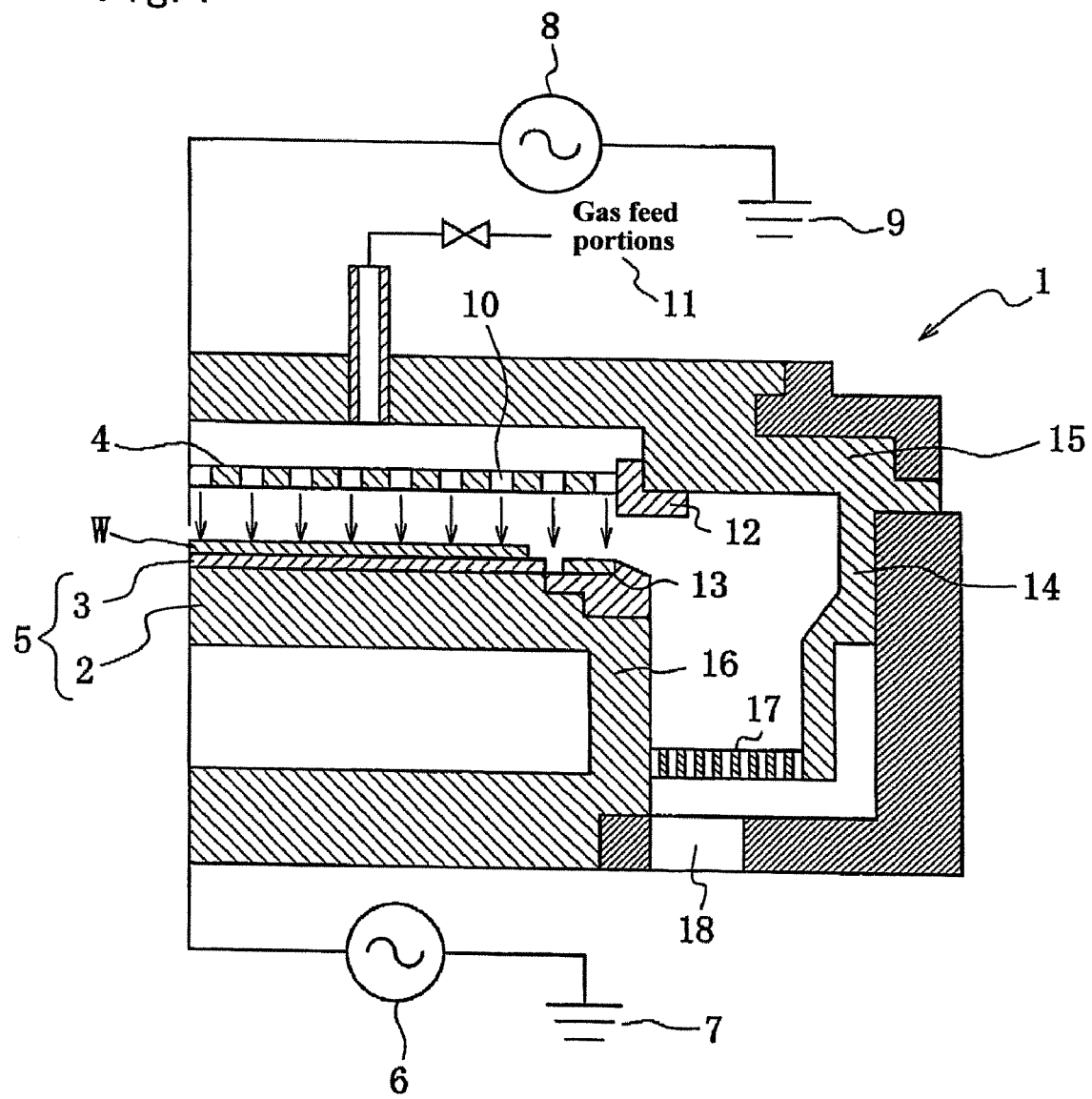
FIG. 1 is a schematic view illustrating an outline structure of a plasma treating apparatus according to an embodiment of the invention.

Details of an embodiment of the invention will be described with reference to the drawings. FIG. 1 is a partial section view of a chamber in a plasma treating apparatus applied to the invention. Moreover, the plasma treating apparatus according to the invention is not limited to the construction shown in FIG. 1.

In FIG. 1, numeral 1 is a chamber for an etching treatment. The chamber 1 is a cylindrical aluminum chamber having, for example, an anodized film (alumite treatment) on its surface and has a structure capable of keeping the etching treatment chamber airtight.

In the interior of the chamber 1 such components are disposed as a lower electrode 2, an electrostatic chuck 3 arranged on the upper face of the lower electrode 2 for keeping a body to be treated such as a semiconductor wafer W or the like by a Coulomb force, and an upper electrode 4 arranged at a predetermined interval above the electrostatic chuck 3. Moreover, the electrostatic chuck 3 has a construction of disposing an electrode for the electrostatic chuck between insulating films each made of, for example, a polyimide resin or the like, and the upper electrode 4 and lower electrode 2 are preferably made of the same material as the chamber 1.

To a mount base 5 constituted with the lower electrode 2 and the electrostatic chuck 3 is connected a lower high-frequency power source (RF power) 7 through a lower matching box 6, wherein a high-frequency power of a predetermined frequency can be supplied from the lower high-frequency power source 7. Further, the upper electrode 4 is connected through an upper matching box 8 to an upper high-frequency power source (RF power) 9.

Moreover, the upper electrode 4 is provided at its lower face with many gas discharge holes 10 and at its top with gas feed portions 11.

To the chamber 1 is connected an evacuation device not shown in FIG. 1 through pipes, in which the interior of the chamber 1 is adjusted to an internal pressure of, for example, about 1.33 Pa-133 Pa by the evacuation device. A given plasma treating gas, for example, an etching gas made of F-containing gas is introduced into the chamber 1 from the gas feed portions 11.

At this state, a predetermined high-frequency power having a relatively low frequency, e.g. a high-frequency power having a frequency of not more than several MHz is supplied from the lower high-frequency power source 7, while a predetermined high-frequency power having a relatively high frequency, e.g. a high-frequency power having a frequency of several ten MHz-one hundred several ten MHz is supplied from the upper high-frequency power source 9 to generate plasma between the upper electrode 4 and the lower electrode 2, whereby the body to be treated such as semiconductor wafer W or the like can be subjected to an etching with such a plasma. Moreover, the high frequency power supplied from the upper high-frequency power source 9 to the upper electrode 4 is used for generating the plasma, while the high frequency power supplied from the lower high-frequency power source 7 to the mount base 5 is used for generating DC bias to control ion energy striking to the semiconductor wafer W.

In the treating chamber 2, members such as a shield ring 12, a focus ring 13, a deposhield 14, an upper insulator 15, a lower insulator 16, a baffle plate 17 and the like are disposed beside the upper electrode 4 and the mount base 5 comprised of the lower electrode 2 and the electrostatic chuck 4 as shown in FIG. 1.

The shield ring 12 and focus ring 13 are substantially ring-shaped bodies made of, for example, silicon carbide or silicon, which are arranged so as to surround each outer periphery of the upper electrode 4 and the lower electrode 2 and constituted to focus the plasma generated between the upper electrode 4 and the lower electrode 2 into the semiconductor wafer W.

Also, the deposhield 14 is arranged to protect the inner wall of the chamber 1, and the upper insulator 15 and the lower insulator 16 are arranged to keep the atmosphere inside the chamber 1, and the baffle plate 17 located below the lower insulator 16 is arranged to seal the generated plasma so as not to flow out from a discharge port 18 located below the plasma treating apparatus.

These members disposed in the chamber 1 are exposed to a plasma excited atmosphere under the F-containing atmosphere or a strong corrosive atmosphere alternately and repeatedly introducing the F-containing gas and the CH-containing gas in the plasma etching.

In general, the F-containing gas mainly contains fluorine or a fluorine compound and may contain oxygen ($O_2$). Fluorine is rich in the reactivity among the halogen elements (strong in the corrosiveness) and reacts with not only a metal but also an oxide or a carbide to produce a corrosion product having a high vapor pressure. Therefore, when the members and the like inside the chamber 1 are exposed to the strong corrosive atmosphere such as F-containing gas atmosphere or the like, even if they are made of the metal, oxide or carbide, the corrosion reaction proceeds without limit because a protection film for suppressing the promotion of the corrosion reaction is not formed on the surface. In this connection, the inventor has discovered that the elements belonging to Group IIIa in the Periodic Table, i.e. Sc, Y and elements of Atomic Numbers 57-71 and oxides thereof indicate a good corrosion resistance even under such an environment.

On the other hand, the CH-containing gas constitutes a reducing reaction atmosphere quite opposite to the oxidation reaction in the F-containing gas atmosphere though CH itself is not strong in the corrosiveness, so that the metal (alloy) or metal compound indicating a relatively stable corrosion resistance in the F-containing gas tends to weaken the chemical bonding force when it is subsequently exposed to the CH-containing gas atmosphere. Therefore, when the portion contacting with the CH-containing gas is again exposed to the F-containing gas atmosphere, the initially stable compound film is chemically broken to finally bring about the proceeding of the corrosion reaction.

Particularly, F and CH are ionized to generate atomic F, C and H having a strong reactivity in the environment generating the plasma in addition to the change of the atmospheric gas kind, so that the corrosiveness and the reducing property are promoted to make the plasma erosion action further severer and hence the corrosive product is easily produced from the surface of the member or the like.

The thus obtained corrosion product is vaporized under this environment or rendered into fine particles to considerably contaminate the inside of the plasma treating vessel such as chamber or the like.

In this point, the treating method using the plasma treating apparatus according to the invention is effective as the countermeasure for the corrosion resistance and erosion resistance under the severe corrosion environment such as F-containing gas atmosphere, a mixed gas atmosphere of F-containing gas and CH-containing gas or alternate repetition of F-containing gas atmosphere and CH-containing gas atmosphere, and also effective for the preventing the occurrence of the corrosive product, particularly the occurrence of particles.

In the invention, therefore, the surfaces of the members and the like placed in the chamber and exposed to the plasma at the same time of subjecting the body to be treated to the plasma treatment are provided with the composite coating comprised of the porous layer made of the metal oxide inclusive of the element belonging to Group IIIa and the secondary recrystallized layer obtained on the porous layer by subjecting the metal oxide to the secondary transformation, whereby the corrosion reaction of these members and the like is suppressed. The composite coating may be formed on all of the members and the like inside the chamber, and particularly it may be naturally formed on only a portion selected as being subjected to a large damage at a high plasma density.

As the F-containing gas, at least one gas selected from a gas represented by the general formula of $C_xF_y$, such as $F_2$, $CF_4$, $C_4F_8$, $C_4F_6$, $C_5F_8$ or the like, a CHF gas such as $CHF_3$, $CH_2F_2$, $CH_3F$ or the like, HF gas, a SF gas such as $SF_6$ or the like, and a mixed gas of fluorine gas represented by CFO such as $CF_2O$ or the like and $O_2$ is preferably used.

As the CH-containing gas, at least one gas selected from a $C_xH_y$ gas such as $H_2$, $CH_4$, $C_2H_2$, $CH_3F$, $CH_2F_2$, $CHF_3$ or the like, a H-containing gas such as $NH_3$ or the like, and a mixed gas of the CH-containing gas or H-containing gas and $O_2$ is preferably used.

Next, the inventors have made studies on materials for the formation of the composite coating to be formed on the surface of the member placed in the chamber, particularly materials showing good corrosion resistance and resistance to environmental contamination even in the atmosphere of F-containing gas or CH-containing gas.

As a result, it has been discovered that as a metal oxide for forming the porous layer, metal oxides of elements belonging to Group IIIa in the Periodic Table indicate excellent resistance to halogen corrosion and resistance to plasma erosion (resistance to contamination through particles of corrosion product) in the corrosion atmosphere as compared with the other oxides. Moreover, the metal oxide of the Group IIIa element is oxides of Sc, Y and lanthanoide of Atomic Number of 57-71 (La, Ce, Pr, Nb, Pm, Sm, Eu, Gd, Tb, Dy, Ho, Er, Tm, Yb, Lu), and particularly it has been discovered that oxides of rare earth elements La, Ce, Eu, Dy and Yb are preferable as to the lanthanoide. In the invention, these metal oxides may be used alone or in a mixture of two or more, a composite oxide, or eutectic mixture.

In the invention, as the process for coating and forming the porous layer made of the metal oxide on the surface of the member or the like is preferably used a spraying process. For this end, the metal oxide of Group IIIa element is first pulverized to form particulates having an average particle size of 5-80 μm as a spraying material powder for the spraying treatment and then the spraying material powder is sprayed onto the surface of the member or the like by a given method to form a porous layer made of a porous spray coating having a thickness of 50-2000 μm (porosity: about 5-20%).

When the thickness of the porous layer is less than 50 μm, the performances as the coating under the above corrosive environment are not sufficient, while when the thickness of this layer exceeds 2000 μm, the mutual bonding force between sprayed particles becomes weak and the stress produced in the formation of the coating (which is considered due to the volume shrinkage reaction and aggregation through quenching of the particles) becomes large and hence the coating is easily broken.

As the method of forming the spray coating of the porous layer are preferable an atmospheric plasma spraying process and a low pressure plasma spraying process, but such method as a water plasma spraying process or a detonation spraying process is applicable in accordance with the use conditions Also, prior to the formation of the porous layer, an undercoat made from a metal, an alloy, ceramics or a cermet of these mixed material may be formed in advance on the surface of the member or the like. By the formation of the undercoat, the adhesion strength between the porous layer and the substrate is increased, and the contact of the corrosive gas with the substrate can be prevented.

The undercoat is preferable to be a metallic coating of Ni and an alloy thereof, Co and an alloy thereof, Al and an alloy thereof, Ti and an alloy thereof, Mo and an alloy thereof, W and an alloy thereof, Cr and an alloy thereof or the like, and the thickness thereof is preferable to be about 50-200 μm.

The undercoat serves to shut off the surface of the member or the like from the corrosive environment to improve the corrosion resistance and to improve the adhesion property between the substrate and the porous layer. Therefore, when the thickness of the undercoat is less than 50 μm, the corrosion resistance is not sufficient but also the uniform formation of the coating is difficult, while when it exceeds 200 μm, the effect on the corrosion resistance is saturated. As the ceramic used in the undercoat, an oxide, a boride, a nitride and a silicide are preferable. The coating may also be formed by using a cermet comprised of the ceramic and the metal or alloy.

As the method of forming the undercoat, the water plasma spraying process, a detonation spraying process and the like may be used in addition to the atmospheric plasma spraying process and low pressure plasma spraying process, and the vapor deposition process and the like may also be used.

As a material for the member or the like inside the treating chamber of the plasma treating apparatus according to the invention can be used metals such as aluminum and an alloy thereof, titanium and an alloy thereof, stainless steel, other special steels, nickel-based alloy and the like (hereinafter "metal" includes alloys thereof) but also ceramics such as quartz, vitrified substance, carbide, boride, silicide, nitride and mixtures thereof, an inorganic material such as cermet comprised of the ceramic and the metal, and plastics. Also, the surface of the substrate made of the above material may be subjected to a metal plating (electric plating, galvanizing, chemical plating) or a metal deposition.

A most discriminative construction of the invention is the presence of the secondary recrystallized layer disposed on the surface of the site, member or the like directly exposed to the plasma treating atmosphere. The secondary recrystallized layer is formed on the porous layer or porous spray coating and is a layer formed by subjecting an outermost surface portion of the porous layer made of the oxide of Group IIIa metal to a secondary transformation.

In case of the metal oxide of Group IIIa element, e.g. yttrium oxide (yttria: $Y_2O_3$), the crystal structure is generally a cubic system belonging to tetragonal system. When the yttrium oxide (hereinafter referred to as yttria) is plasma-sprayed, the fused particles are ultra-quenched while flying toward the substrate at a high speed and deposited on the surface of the substrate in collision, during which the crystal structure is primary-transformed into a crystal structure of a mixed crystal type including monoclinic system in addition to the cubic system. This is a porous layer of the metal oxide. The secondary recrystallized layer means a layer that the porous layer of the metal oxide having a mixed crystal state inclusive of rhombic system and tetragonal system primary-transformed by ultra-quenching in the spraying is again secondary-transformed into a tetragonal system by the spraying treatment.

Figure 4A:
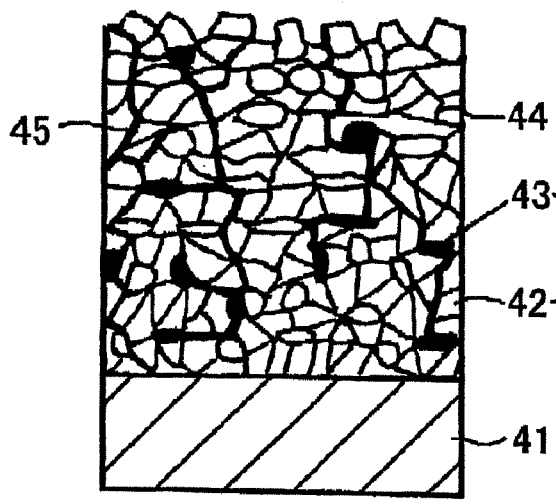
FIG. 4(a) is a section view of a coating formed by the method of the conventional technique, and (b) and (c) are partial section views of a member formed with a secondary recrystallized layer as an outermost layer and a member having an undercoat by the method of the invention.
Figure 4B:
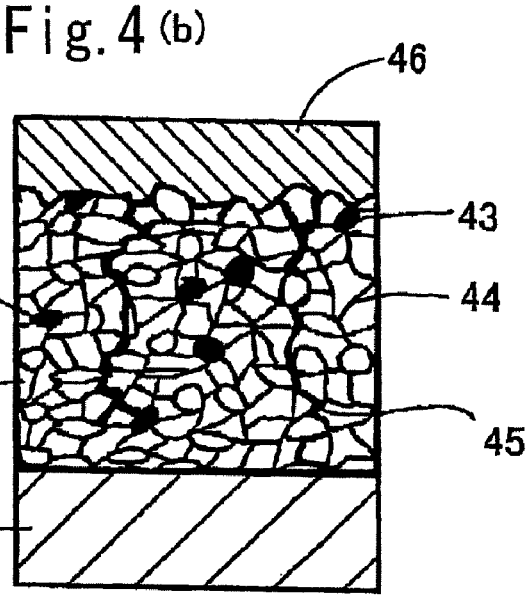
Figure 4C:
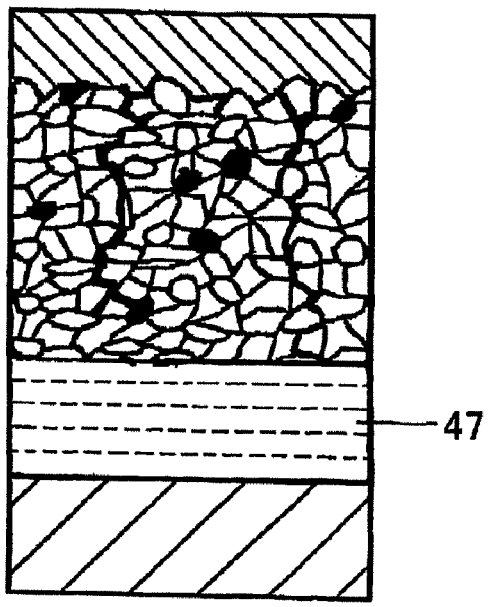

FIG. 4 schematically shows the change of micro-structure in $Y_2O_3$ spray coating (porous coating), a coating after an electron beam irradiation treatment and the vicinity of the composite coating having an undercoat layer. In a non-irradiated test specimen shown in FIG. 4(a), the sprayed particles constituting the coating are existent independently and the surface roughness is large. By the electron beam irradiation treatment shown in FIG. 4(b) is produced a new layer having a different micro-structure on the spray coating. This layer is a compact layer formed by bonding the sprayed particles to each other at a fused state with less voids. Moreover, FIG. 4(c) shows an example having an undercoat.

Moreover, the coating having many pores inherent to the spray coating is existent below the compact layer produced by the electron beam irradiation, which is a layer having an excellent resistance to thermal shock.

Figure 5:
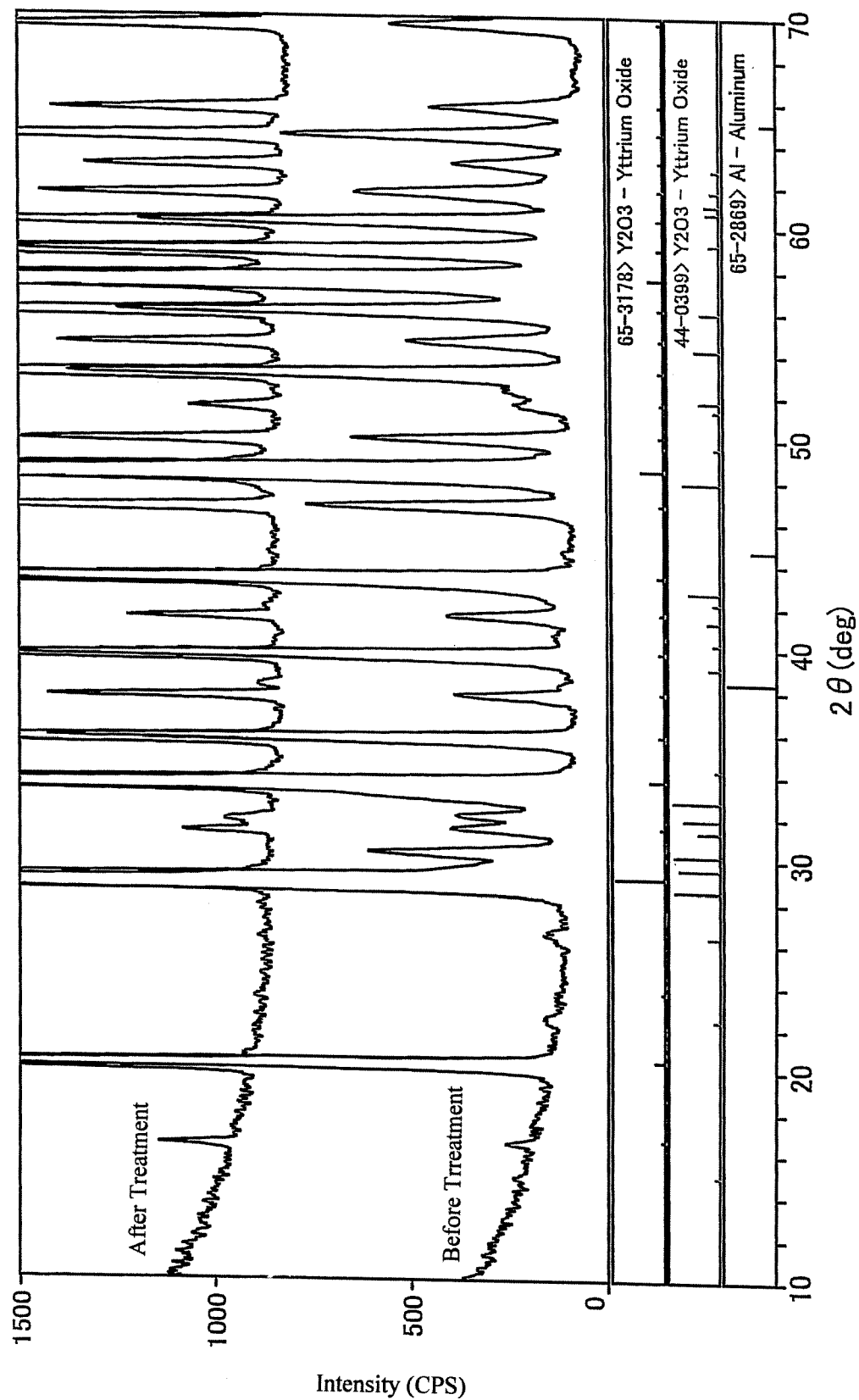
FIG. 5 is an X-ray diffraction pattern of $Y_2O_3$ spray coating (porous layer) and secondary recrystallized layer formed by an electron beam irradiation treatment.
Figure 6:
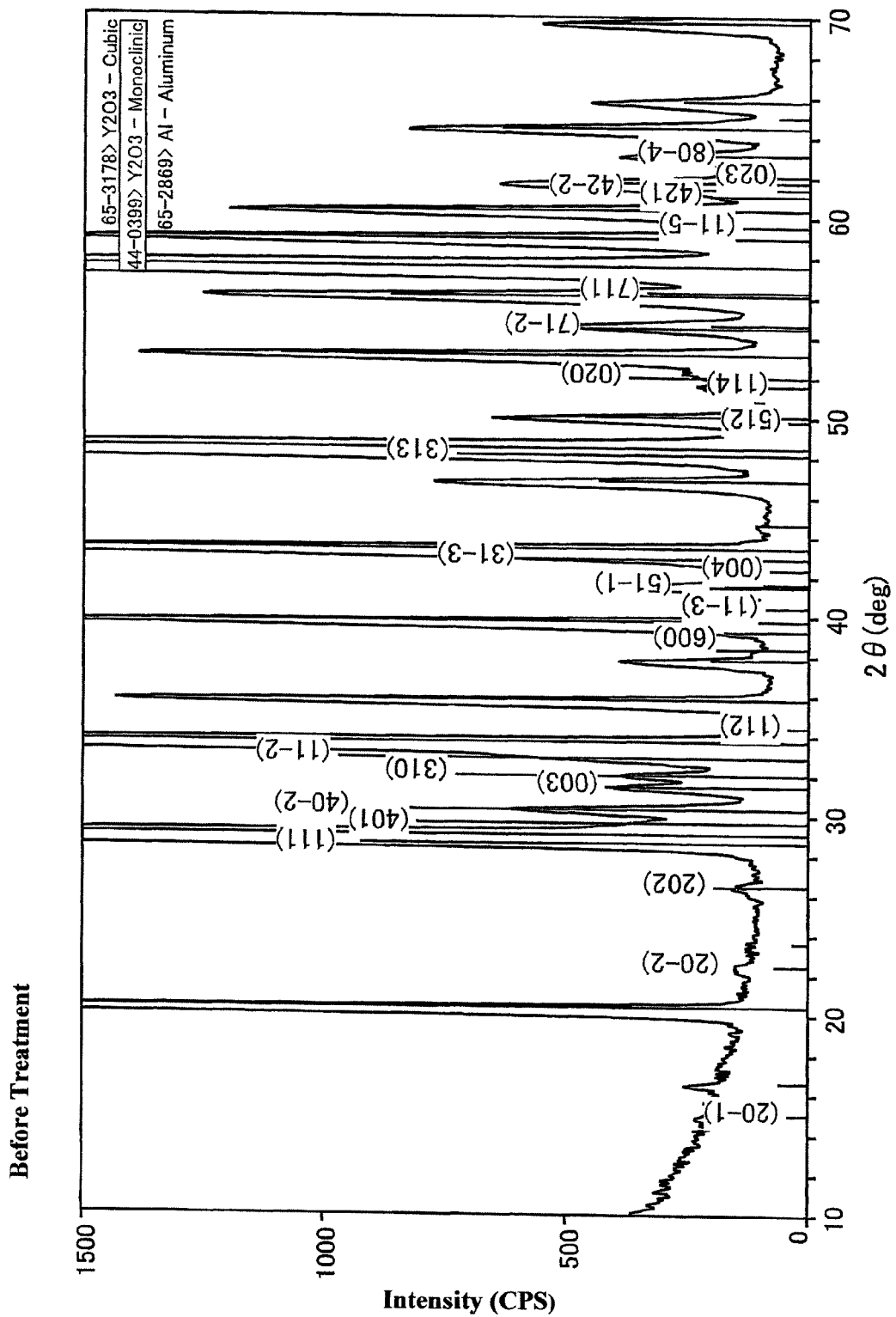
FIG. 6 is an X-ray diffraction pattern at a state of $Y_2O_3$ spray coating (porous layer) before an electron beam irradiation treatment.
Figure 7:
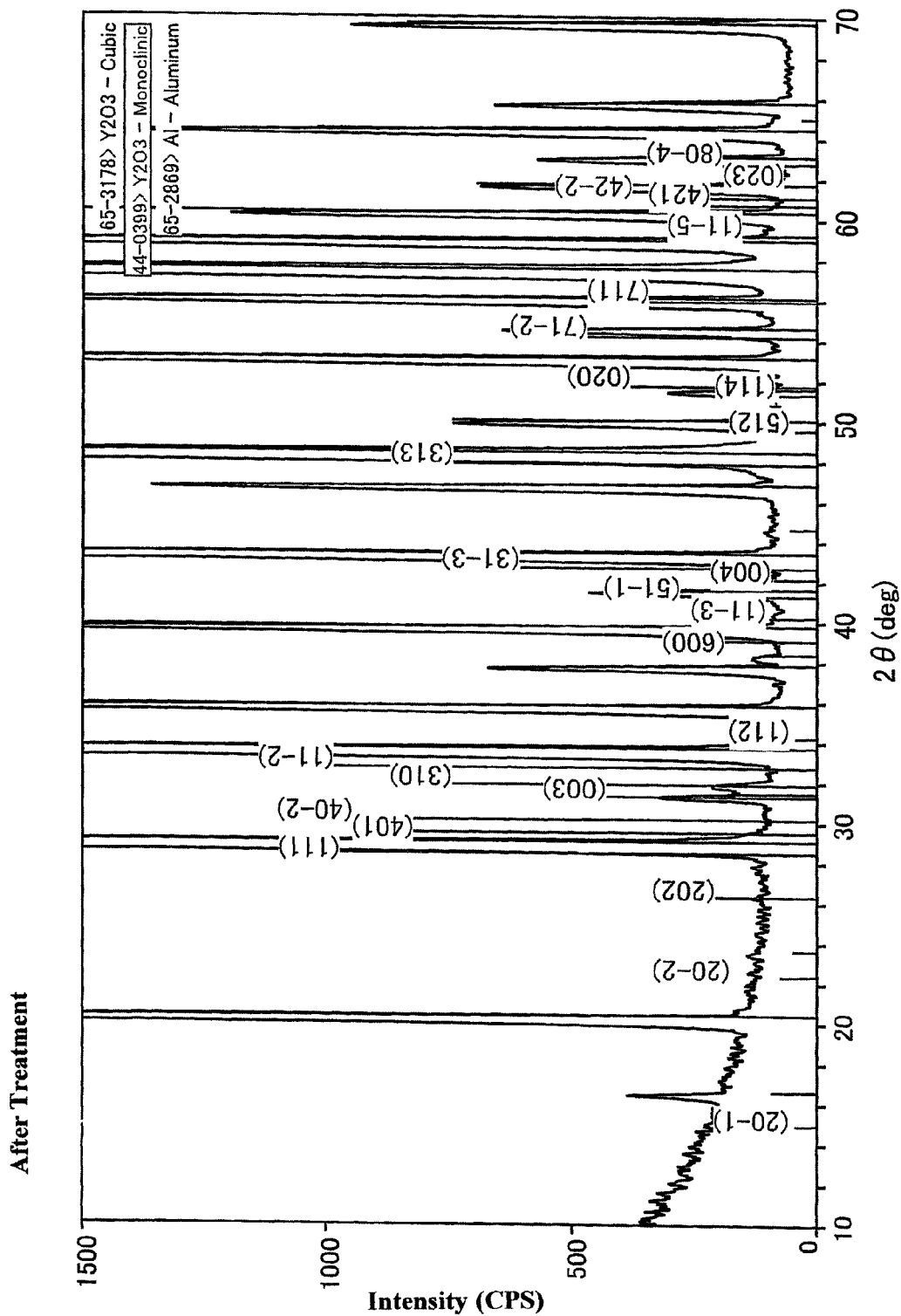
FIG. 7 is an X-ray diffraction pattern at a state of $Y_2O_3$ spray coating (porous layer) after an electron beam irradiation treatment.

FIG. 5 is XRD measured charts of the porous layer of $Y_2O_3$ spray coating and the secondary recrystallized layer produced by the electron beam irradiation treatment under the following conditions, respectively. FIG. 6 and 7 are XRD patterns of $Y_2O_3$ spray coating (porous layer) before and after the electron beam irradiation treatment. That is, FIG. 6 is an X-ray diffraction chart before the treatment by enlarging the ordinate, and FIG. 7 is an X-ray diffraction chart after the treatment by enlarging the ordinate. As seen from FIG. 6, in the $Y_2O_3$ spray coating before the treatment is particularly observed a peak showing a monoclinic system within a range of 30-35°, from which a mixed state of cubic system and monoclinic system is seen. On the contrary, as shown in FIG. 7, the secondary recrystallized layer obtained by subjecting the $Y_2O_3$ spray coating to the electron beam irradiation treatment is seen to be only the cubic system because peak showing $Y_2O_3$ particles is sharp and peak of monoclinic system decreases and plane index (202), (310) or the like can not be confirmed. Moreover, the XRD test is carried out by using an X-ray diffraction apparatus of RINT 1500 made by Rigaku Denki Co., Ltd. The X-ray diffraction conditions are as follows.

| | |
|---|---|
| Output: | 40 kV |
| Scanning rate: | 20/min |

In FIG. 4, numeral 41 is a substrate, numeral 42 a porous layer (spray particle deposit layer), numeral 43 a pore (void), numeral 44 a particle interface, numeral 45 a through-hole, numeral 46 a secondary recrystallized layer produced by the electron beam irradiation treatment, and numeral 47 an undercoat. Moreover, the same change of the micro-structure as in the electron beam irradiated face is confirmed even in a laser beam irradiation treatment as observed by means of an optical microscope.

In the invention, the porous layer of the Group IIIa metal oxide having a crystal structure composed mainly of primary-transformed rhombic system is crystallographically stabilized by heating the volume spray particles of the porous layer at least above the melting point through the high energy irradiation treatment and then again transforming (secondary-transforming) this layer to return the crystal structure to a structure of tetragonal system.

At the same time, thermal strain or mechanical strain stored in the spray particle deposit layer in the primary transformation through spraying is released to physically and chemically stabilize the properties, and also the densification and smoothening of the layer accompanied with the fusion are realized. As a result, the secondary recrystallized layer comprised of the metal oxide of Group IIIa element becomes a compact and smooth layer as compared with the as-sprayed layer.

Therefore, the secondary recrystallized layer is a densified layer having a porosity of less than 5%, preferably less than 2% in which the surface has an average roughness (Ra) of 0.8-3.0 μm, a maximum roughness (Ry) of 6-16 μm and a 10-point average roughness (Rz) of about 3-14 μm, which is considerably different from the porous layer. Moreover, the control of the maximum roughness (Ry) is determined from a viewpoint of the resistance to environmental contamination. Because, when the surface of the member in the container is scraped by plasma ions or electrons excited in the etching atmosphere and particles are generated, the influence is well seen in the value of the maximum roughness (Ry) and as this value is large, the chance of generating the particles increases.

The high energy irradiation method for the formation of the secondary recrystallized layer will be described below. As the method adopted in the invention an electron beam irradiation treatment, and a laser beam irradiation treatment of $CO_2$ laser, YAG laser and the like are preferably used, but not limited to only these methods.

(1) Electron beam irradiation treatment: As the condition of this treatment, it is recommended that an inert gas such as Ar gas or the like is introduced into an oxygen-evacuated irradiation room and the treatment is carried out under the following irradiation conditions:

| | |
|---|---|
| Irradiation atmosphere: | 0-0.0005 Pa (Ar gas) |
| Beam irradiating power: | 0.1-8 kW |
| Treating rate: | 1-30 mm/s |

Of course, these conditions are not limited to the above range. The above exemplifies the preferable conditions for obtaining the preferable secondary recrystallized layer. As far as the given effect of the invention can be obtained, the conditions are not limited to the above.

The metal oxide inclusive of Group IIIa element treated by the electron beam irradiation becomes a fused state because the temperature is raised from the surface and finally arrives at above the melting point. This fusion phenomenon is gradually penetrated into the interior of the coating by making the electron beam irradiating power large or by increasing the irradiation frequency or by making the irradiation time long, so that the depth of the irradiation fused layer can be controlled by changing such irradiation conditions. Practically, the secondary recrystallized layer suitable for achieving the object of the invention is obtained when the fusion depth is 1-50 μm.

(2) As the laser beam can be used YAG laser utilizing YAG crystal or $CO_2$ gas laser when the medium is a gas. As the irradiation treatment of the laser beam are recommended the following conditions:

| | |
|---|---|
| Laser power: | 0.1-10 kW |
| Laser bean area: | 0.01-2500 mm² |
| Treating rate: | 5-1000 mm/s |

As previously mentioned, the layer treated by the electron beam irradiation or laser beam irradiation changes into a physically and chemically stable crystal form by transforming at a high temperature and precipitating the secondary recrystal in the cooling, so that the modification of the coating proceeds in unit of crystal level. For example, in the $Y_2O_3$ coating formed by the atmospheric plasma spraying method, the crystal is mainly the rhombic system at the spraying state and changes substantially into the cubic system after the electron beam irradiation as previously mentioned.

The features of the secondary recrystallized layer made of the metal oxide of Group IIIa element through the high energy irradiation treatment are summarized below.

a. The secondary recrystallized layer produced by the high energy irradiation treatment is one formed by further secondary-transforming the porous layer made of the metal oxide as the primary transformed underlayer, or by densifying the porous layer due to the heating the oxide particles disposed in the under layer above melting point to fuse at least a part of thereof.

b. When the secondary recrystallized layer produced by the high energy irradiation treatment is a layer obtained by further secondary-transforming the porous layer of the metal oxide located therebeneath, or when this layer is particularly the spray coating formed by the spraying method, non-fused particles in the spraying are completely fused and the surface is rendered into a mirror face and hence projections easily subjected to the plasma etching are vanished.

c. Since the secondary recrystallized layer is formed by the high energy irradiation treatment of the porous layer based on the above effects a and b, the through-holes are clogged, so that the corrosive gas will not flow into the interior (substrate) through the through-holes, and hence the corrosion resistance is improved. Also, the layer is densified, so that the strong resistance force is developed against the plasma etching action, and as a result, the excellent resistance to corrosion and plasma erosion is provided over a long time of period.

d. Since the secondary recrystallized layer is a physically and chemically stable crystal, the modification can be attained at a crystal level. Further, the thermal strain introduced in the spraying is simultaneously released to form a stable layer.

e. The thickness of the secondary recrystallized layer produced by the high energy irradiation treatment is preferably about 1-50 μm from the surface. When the thickness is less than 1 μm, the effect of forming the coating is not obtained, while when it exceeds 50 μm, the burden of the high energy irradiation treatment becomes large and the effect of forming the coating is saturated.

Moreover, the porous layer located beneath the above layer is existent as a layer having an excellent resistance to thermal shock and also has a feature of bearing the buffer action together with the upper layer. That is, it has an effect of mitigating the thermal shock over the whole of the coating while acting to mitigate the thermal shock applied to the dense secondary recrystallized layer as the upper layer. In this meaning, when the composite coating is formed by laminating the secondary recrystallized layer as an upper layer on the porous layer made of the spray coating as a lower layer, the synergistic effect is produced by the composite action of both layers to improve the durability of the coating.

Also, when the etching is carried out at a high plasma power as mentioned above, the difference of potential between the member or the like inside the chamber and the plasma becomes large, and the spray coating of $Y_2O_3$ or the like coated onto the member or the like is corroded to produce the particles of the corrosion product, which are fallen down and adhered onto the body to bring about the device fault. In the plasma treating apparatus according to the invention, however, the resistance to erosion in the coating formed on the surface of the member or the like is improved, so that even when the plasma power is increased, the difference of potential between the member or the like and the plasma is about 550 V, the occurrence of the particles can be suppressed. Moreover, the difference of potential between the member or the like and the plasma is controlled by a power applied from the high frequency power source 7 to the mount base 5 shown in FIG. 1, and is preferably not more than 550 V, more preferably not less than 120 V but not more than 550 V.

EXAMPLE 1

Figure 2:
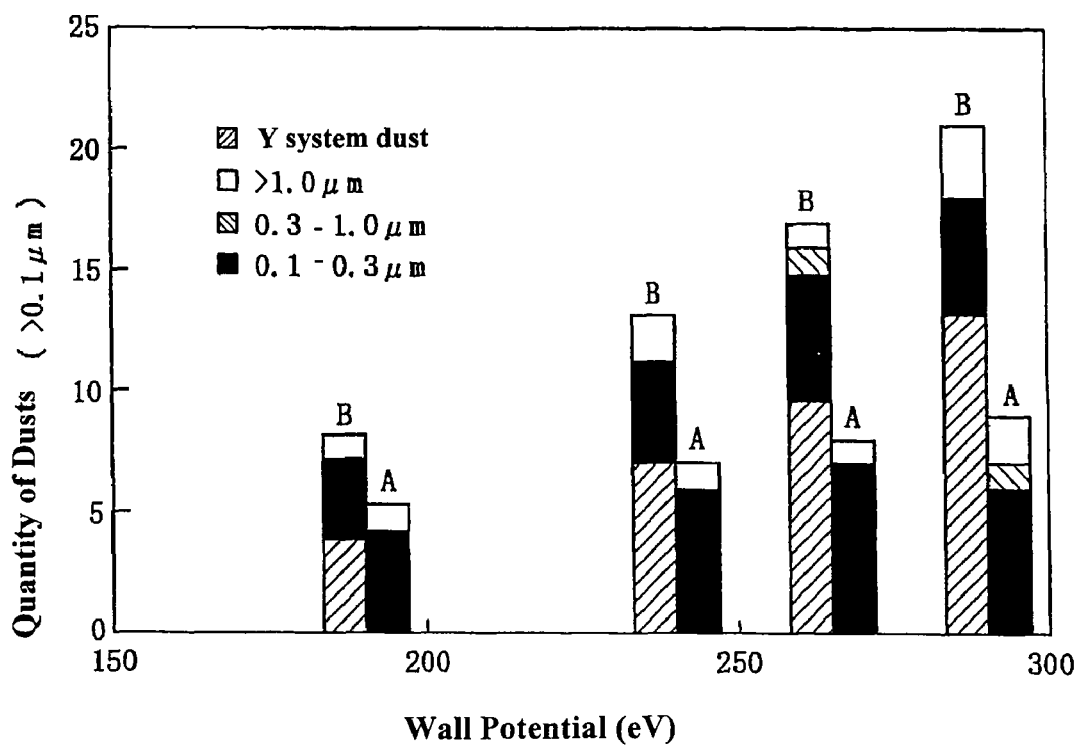
FIG. 2 is a graph showing a relation between potential applied to a member or the like treated in a chamber and a quantity of dusts (particles) generated due to $Y_2O_3$.

Onto a surface of an inner wall member (baffle made of aluminum) of a chamber in a plasma treating apparatus shown in FIG. 1 is sprayed $Y_2O_3$ as an example of Group IIIa metal oxide (purity: 95 mass % or more) to form a coating (Comparative Example B), while $Y_2O_3$ is sprayed to form a coating and then a surface thereof is irradiated with an electron beam to conduct secondary transformation to form a secondary recrystallized layer (Invention Example A). Into each chamber F-containing gas and CH-containing gas are alternately and repeatedly introduced to conduct a plasma treatment, whereby the $Y_2O_3$ spray coating is weakened, and a difference between potential of chamber wall and plasma potential is changed to 200-300 V by controlling a quantity of high frequency power applied to a mount base for a semiconductor wafer as a body to be treated through plasma to measure a quantity of dust (particles) generated on the semiconductor wafer at each potential difference. The results are shown in FIG. 2.

As a result, in Comparative Example B, the dust resulted from the semiconductor wafer as well as the dust resulted from the coating are generated as the potential difference is increased, while in Invention Example A, the dust resulted from the semiconductor wager is observed, but the particles resulted from the coating component (yttrium) are not quite observed or are generated only in small amount.

EXAMPLE 2

Figure 3:
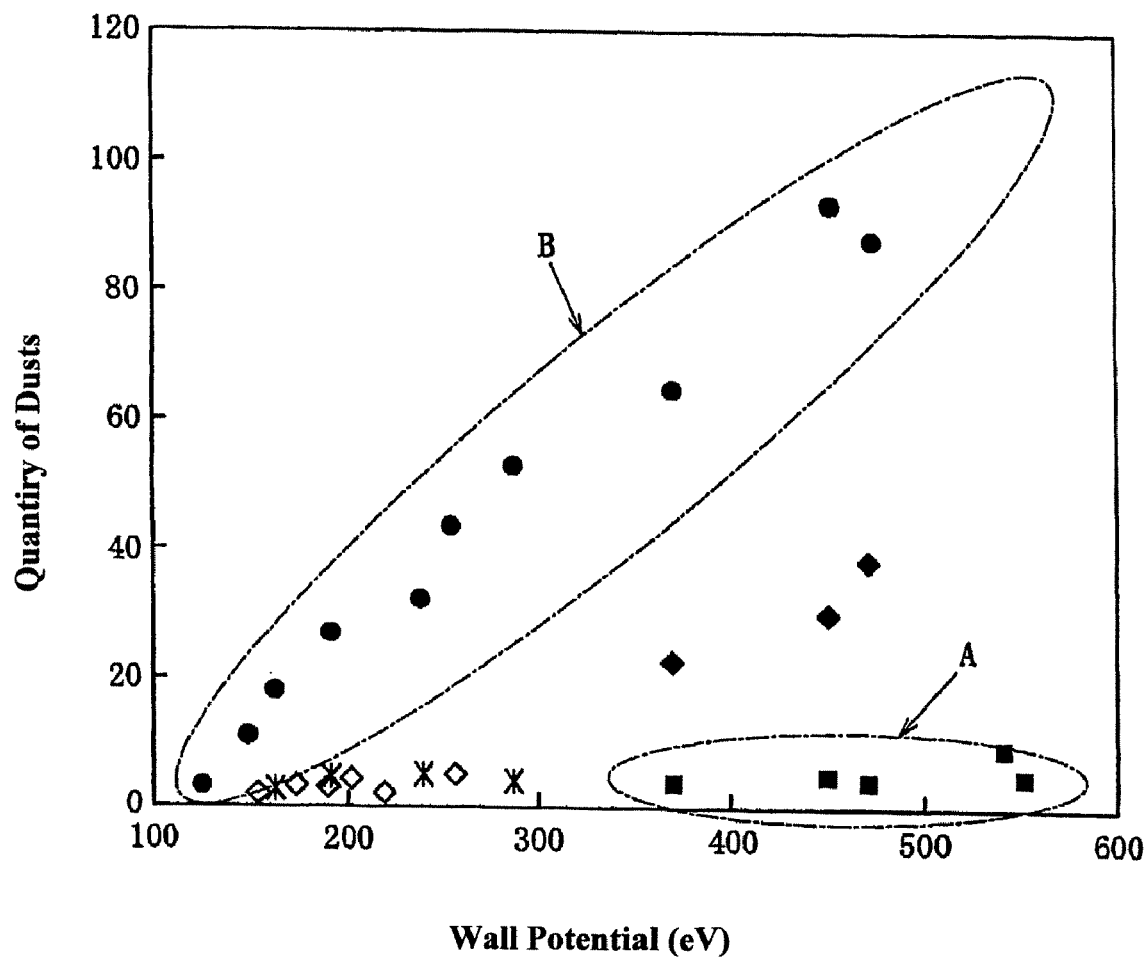
FIG. 3 is a graph showing a relation between potential applied to a member or the like treated in a chamber and a quantity of dusts (particles) generated due to $Y_2O_3$.

In order to examine a limit value of potential difference (range capable of suppressing the occurrence of dust resulted from the coating (yttrium)) between inner wall members in the plasma treating container (lower aluminum insulator, baffle, deposhield) and plasma, the coating formed by spraying $Y_2O_3$ onto the surface of the inner wall member (Comparative Example B) and the coating formed by spraying $Y_2O_3$ onto a surface thereof and by irradiating with an electron beam to conduct secondary transformation to form a secondary recrystallized layer (Invention Example A) are provided like Example 1. F-containing gas and CH-containing gas are alternately and repeatedly introduced into each treating vessel to conduct a plasma treatment, whereby the $Y_2O_3$ spray coating is weakened, and a potential difference between the member or the like and plasma is changed by controlling a quantity of high frequency power applied to a lower electrode to measure a quantity of dust (particles) generated on the semiconductor wafer at each potential difference. The results are shown in FIG. 3.

As a result, in Comparative Example B, the dust resulted from yttrium is increased in proportion to the increase of the potential difference, while in Invention Example A, the occurrence of the dust resulted from yttrium is not observed even at 550 V. Therefore, even when the potential difference is increased to 550 V at maximum in the plasma treating apparatus according to the invention, it is possible to suppress the occurrence of the dust resulted from yttrium.

INDUSTRIAL APPLICABILITY

The technique of the invention is used as a surface treating technique for not only members and parts used in the general semiconductor processing apparatus but also members for a plasma treating apparatus recently requiring more precision and high process. Particularly, the invention is suitable as a surface treating technique for member, parts or the like such as deposhield, baffle plate, focus ring, upper and lower insulator rings, shield ring, bellows cover, electrode, solid dielectric and the like in the apparatus using F-containing gas or CH-containing gas or the semiconductor processing apparatus conducting plasma treatment in a severer atmosphere alternately and repeatedly using both gases. Also, the invention is applicable as a surface treating technique for members in a liquid crystal device production apparatus.

The invention claimed is:

1. A method for treating a surface of a body to be treated, in a process chamber, with a plasma of an etching gas, the method comprising:

forming a composite layer including a porous layer made from a metal oxide and a secondary recrystallized layer of the metal oxide formed on the porous layer;

covering with the composite layer at least one of a surface site of the process chamber itself which is exposed to the plasma atmosphere, a surface of a member accommodated in the process chamber which is exposed to the plasma atmosphere, and a surface of a part accommodated in the process chamber which is exposed to the plasma atmosphere; and introducing a first gas including a fluorine-containing gas into the process chamber and exciting the gas to generate a first plasma for treating the body to be treated.

2. A method for treating a surface of a body to be treated, in a process chamber, with a plasma of an etching gas, the method comprising:

forming a composite layer including a porous layer made from a metal oxide and a secondary recrystallized layer of the metal oxide formed on the porous layer;

covering with the composite layer at least one of a surface site of the process chamber itself which is exposed to the plasma atmosphere, a surface of a member accommodated in the process chamber which is exposed to the plasma atmosphere, or a surface of a part accommodated in the process chamber which is exposed to the plasma atmosphere;

introducing a first gas including a fluorine-containing gas into the process chamber and exciting the first gas to generate a first plasma; and introducing a second gas including a hydrocarbon gas into the process chamber and exciting the second gas to generate a second plasma.

3. A method for treating with plasma according to claim 1 or 2, wherein the metal oxide is a metal oxide including a Group IIIA element.

4. A method for treating with plasma according to claim 1 or 2, wherein the secondary recrystallized layer is formed by subjecting a primary transformed metal oxide included in the porous layer to a high energy irradiation treatment to conduct secondary transformation.

5. A method for treating with plasma according to claim 4, wherein the high energy irradiation treatment is an electron beam irradiation treatment or a laser beam irradiation treatment.

6. A method for treating with plasma according to claim 1 or 2, wherein the secondary recrystallized layer is a layer of a tetragonal system structure formed by subjecting the porous layer including a rhombic system crystal to a high energy irradiation treatment to conduct secondary transformation.

7. A method for treating with plasma according to claim 6, wherein the high energy irradiation treatment is an electron beam irradiation treatment or a laser beam irradiation treatment.

8. A method for treating with plasma according to claim 1 or 2, wherein a difference of potential between the surface site, the member or the part exposed to the plasma atmosphere in the chamber, and the plasma is not less than 120 V and not more than 550 V.

9. A method for treating with plasma according to claim 1 or 2, wherein at least one gas selected from a $C_xF_y$ gas, a CHF based gas, a HF based gas, a SF based gas and a mixed gas of fluorine gas and $O_2$ is used as the fluorine-containing gas.

10. A method for treating with plasma according to claim 2, wherein at least one gas selected from a $C_xH_y$ gas, a H-containing gas, and a mixed gas of $C_xH_y$ gas and $O_2$ is used as the hydrocarbon containing gas.

11. A method for treating with plasma according to claim 8, wherein the difference of potential is controlled by a high frequency power applied to a mount base for the body to be treated in the chamber.

* * * * *